(12) United States Patent
Honda et al.

(10) Patent No.: US 9,740,250 B2
(45) Date of Patent: Aug. 22, 2017

(54) ELECTRONIC DEVICE

(71) Applicant: FUJITSU LIMITED, Kawasaki-shi, Kanagawa (JP)

(72) Inventors: Masao Honda, Kato (JP); Yoshito Fukata, Kato (JP); Takeshi Karuishi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 118 days.

(21) Appl. No.: 14/340,229

(22) Filed: Jul. 24, 2014

(65) Prior Publication Data

US 2015/0061478 A1 Mar. 5, 2015

(30) Foreign Application Priority Data

Aug. 29, 2013 (JP) ................................. 2013-178390

(51) Int. Cl.
| | |
|---|---|
| *H05K 7/20* | (2006.01) |
| *G06F 1/20* | (2006.01) |
| *H05K 5/06* | (2006.01) |
| *H05K 9/00* | (2006.01) |

(52) U.S. Cl.
CPC .............. *G06F 1/20* (2013.01); *H05K 5/064* (2013.01); *G06F 1/203* (2013.01); *H05K 5/065* (2013.01); *H05K 7/20* (2013.01); *H05K 9/0015* (2013.01)

(58) Field of Classification Search
CPC .......... G06F 1/20; G06F 1/1613; G06F 1/203; G06F 1/206; G06F 15/0216; G06F 2200/201; H04M 1/0202; A47B 31/02; H02B 1/56; H05K 7/20963; G02F 1/133385

USPC ....... 312/236; 361/676, 679.46, 679.47, 688, 361/697, 679.48, 695

See application file for complete search history.

(56) References Cited

U.S. PATENT DOCUMENTS

| | | | | |
|---|---|---|---|---|
| 6,208,511 | B1* | 3/2001 | Bortolini | H05K 7/20236 257/714 |
| 6,606,244 | B1* | 8/2003 | Liu | G06F 1/1613 257/E23.099 |
| 6,618,248 | B1* | 9/2003 | Dalheimer | G06F 1/18 312/223.1 |
| 6,781,846 | B1* | 8/2004 | Suzuki | G06F 1/203 361/737 |
| 7,649,736 | B2* | 1/2010 | Hongo | G06F 1/203 165/104.21 |

(Continued)

FOREIGN PATENT DOCUMENTS

| | | |
|---|---|---|
| JP | 11-194859 A | 7/1999 |
| JP | 2002-57481 A | 2/2002 |

(Continued)

*Primary Examiner* — Jayprakash N Gandhi
*Assistant Examiner* — Stephen Sul
(74) *Attorney, Agent, or Firm* — Westerman, Hattori, Daniels & Adrian, LLP

(57) ABSTRACT

An electronic device includes a housing body, a dividing member that divides the housing body into a first compartment and a second compartment, a sealing member that divides the first compartment into a liquid-stopper region and an exterior communication region, one or more heat emitting components disposed in the liquid-stopper region, a fan disposed in the exterior communication region, and a ventilation pathway through which an airflow passes through the dividing member to the second compartment due to driving the fan.

16 Claims, 11 Drawing Sheets

(56) References Cited

U.S. PATENT DOCUMENTS

| | | | | |
|---|---|---|---|---|
| 2006/0002081 | A1* | 1/2006 | Hongo | G06F 1/203 |
| | | | | 361/691 |
| 2008/0030955 | A1 | 2/2008 | Chen et al. | |
| 2008/0081679 | A1 | 4/2008 | Kawasaki et al. | |
| 2010/0167636 | A1* | 7/2010 | Bhattacharya | G06F 1/206 |
| | | | | 454/239 |
| 2011/0279977 | A1* | 11/2011 | Tanaka | G06F 1/203 |
| | | | | 361/697 |
| 2012/0039037 | A1* | 2/2012 | Hsieh | G06F 1/181 |
| | | | | 361/679.49 |
| 2013/0058018 | A1* | 3/2013 | Song | G06F 1/1626 |
| | | | | 361/679.01 |
| 2013/0148299 | A1* | 6/2013 | Honda | H01L 23/4006 |
| | | | | 361/700 |

FOREIGN PATENT DOCUMENTS

| | | |
|---|---|---|
| JP | 2008-41078 A | 2/2008 |
| JP | 2009-5326 A | 1/2009 |

\* cited by examiner

ELECTRONIC DEVICE

CROSS-REFERENCE TO RELATED APPLICATION

This application is based upon and claims the benefit of priority of the prior Japanese Patent Application No. 2013-178390, filed on Aug. 29, 2013, the entire contents of which are incorporated herein by reference.

FIELD

The embodiments discussed herein are related to an electronic device.

BACKGROUND

A radiator and a fan are provided in a partitioned chamber in a housing, and configured such that heat from a heat source is transferred to the radiator through a heat pipe connected to the radiator.

Related Patent Documents

Japanese Laid-Open Patent Publication No. 2008-41078

SUMMARY

According to an aspect of the embodiments, an electronic device includes: a housing body; a dividing member that divides the housing body into a first compartment and a second compartment; a sealing member that divides the first compartment into a liquid-stopper region and an exterior communication region; one or more heat emitting components disposed in the liquid-stopper region; a fan disposed in the exterior communication region; and a ventilation pathway through which an airflow passes through the dividing member to the second compartment due to driving the fan.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
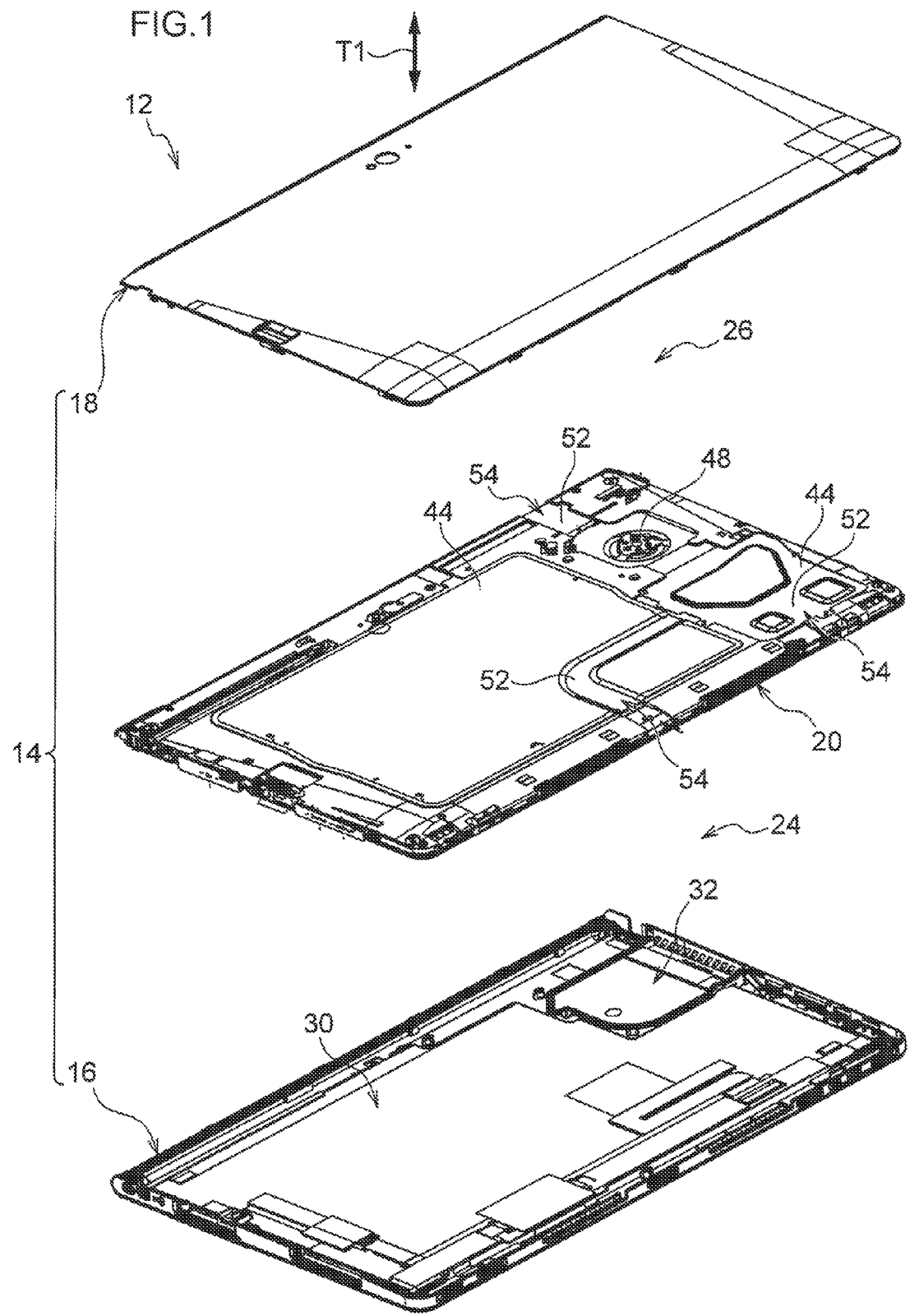
FIG. 1 is an exploded perspective view, partially illustrating an electronic device of a first exemplary embodiment.

Detailed explanation follows regarding a first exemplary embodiment, based on the drawings.

FIG. 1 to FIG. 4 illustrate an electronic device 12 of the first exemplary embodiment. An example is given, as an example of the electronic device 12, of a data processing device that is internally provided with a processor and memory, and that performs operations such as exchanging data with an external device and a recording medium, or internal data processing, although there is no limitation thereto. The electronic device 12 includes a housing body 14, and a dividing plate 20 disposed inside the housing body 14.

The housing body 14 includes a first plate member 16, and a second plate member 18. In the present exemplary embodiment, the first plate member 16 and the second plate member 18 are both rectangular as viewed along the plate thickness direction (the arrow T1 direction), and have the same external shape as each other. External peripheral portions are connected together when the first plate member 16 and the second plate member 18 are in a mutually parallel state, thereby producing a space between the first plate member 16 and the second plate member 18.

The dividing plate 20 is disposed between the first plate member 16 and the second plate member 18, and parallel to the first plate member 16. The dividing plate 20 divides the space between the first plate member 16 and the second plate member 18 into a first compartment 24 at the first plate member 16 side, and a second compartment 26 at the second plate member 18 side. The dividing plate 20 serves as an example of a dividing member.

Hereafter, reference simply to "plan view" refers to a plan view of the housing body 14. This plan view direction matches the plate thickness direction (the arrow T1 direction), mentioned earlier, and also matches the plan view direction of the first plate member 16, the second plate member 18, and the dividing plate 20.

Figure 3:
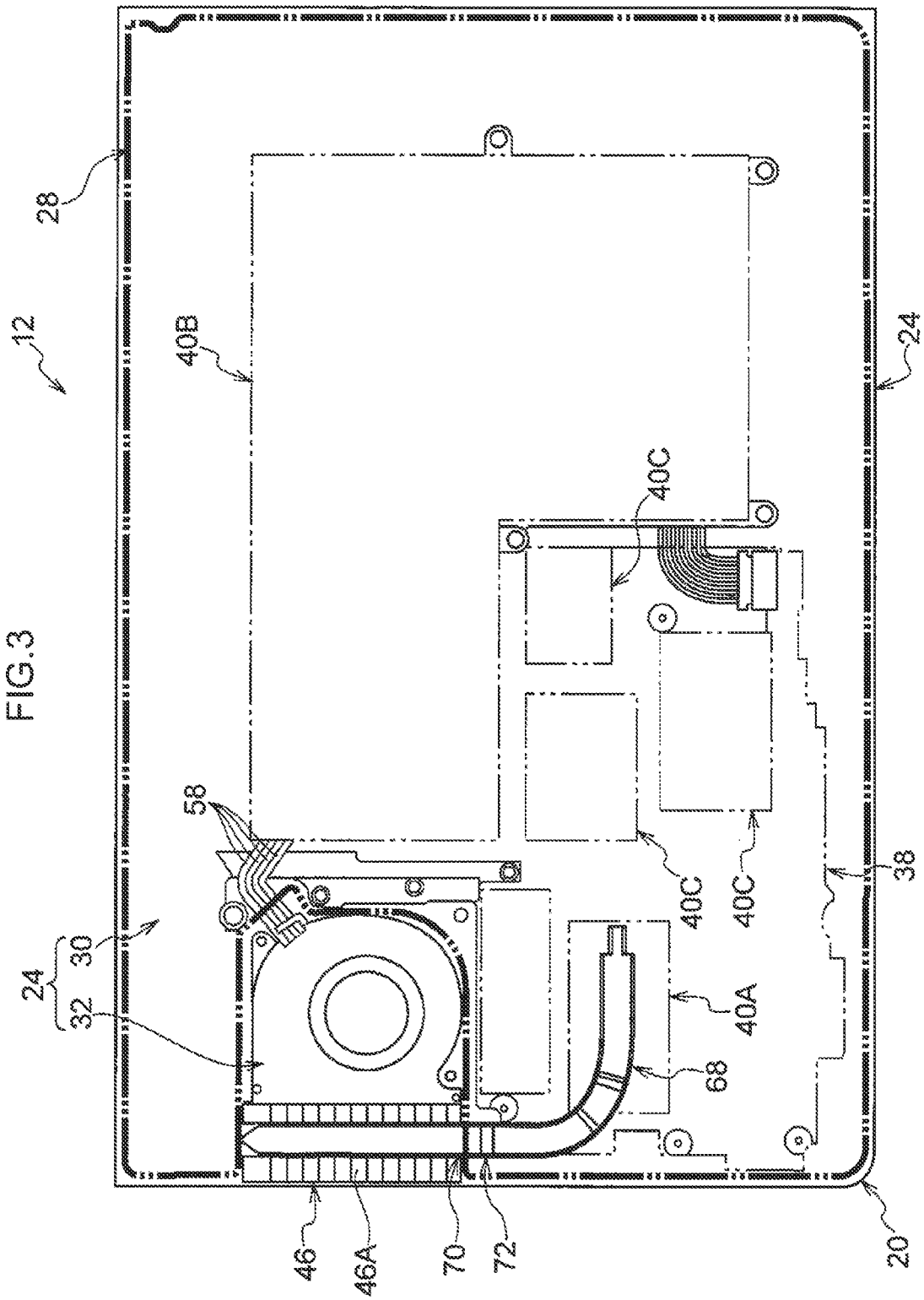
FIG. 3 is a back face view illustrating the interior of an electronic device of the first exemplary embodiment.

As illustrated in FIG. 3, a sealing member 28 is disposed in the first compartment 24. In the first compartment 24, the sealing member 28 is a sealant, a resilient member (rubber for example), or the like, that forms a closed curve in plan view. The sealing member 28 makes close contact with the first plate member 16 and the dividing plate 20. A liquid-stopper (water-stopper) region 30, impermeable to liquid from outside, is thereby formed within the sealing member 28. Note that FIG. 3 is a back face view of the dividing plate 20, viewed from the first plate member 16 (the first compartment 24) side and illustrating positions, such as positions of heat emitting sections 40, described later.

In the plan view, a portion of the sealing member 28 dips inwards from an edge of the dividing plate 20 (the housing body 14). An exterior communication region 32, in communication with the housing body 14 exterior, is thereby formed between the first plate member 16 and the dividing plate 20.

Figure 8:
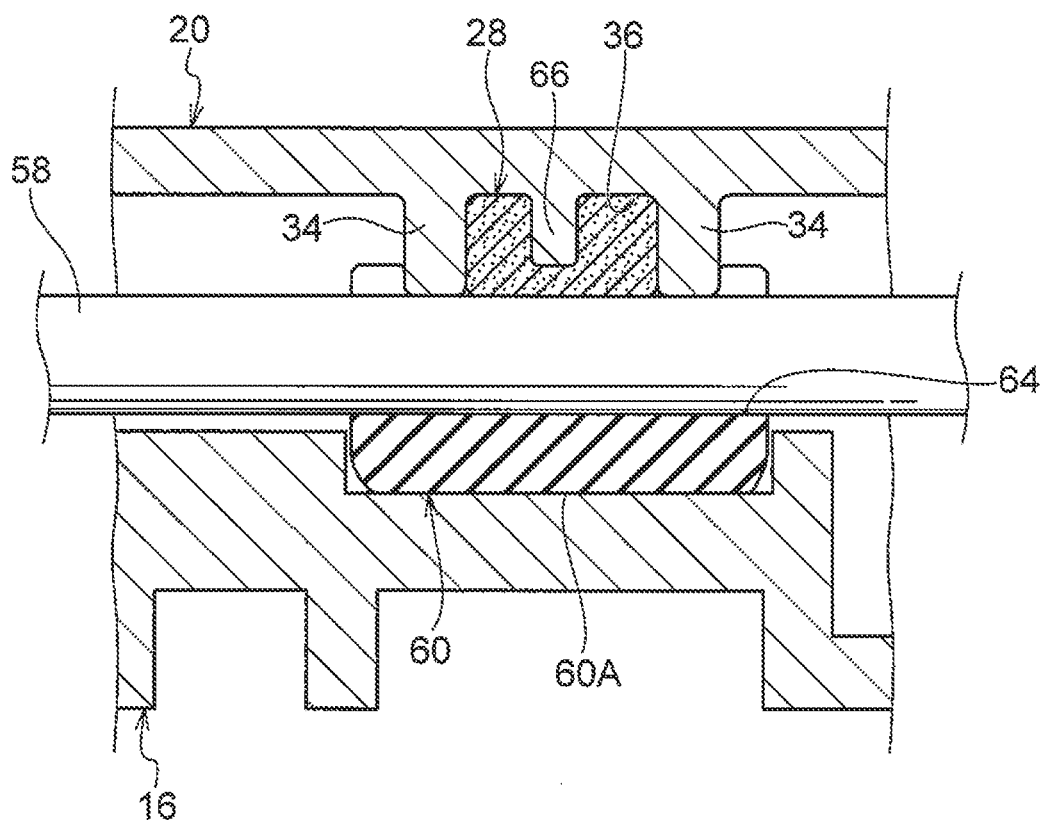
FIG. 8 is a cross-section, taken on line 8-8 in FIG. 7 and partially illustrating an electronic device of the first exemplary embodiment.
Figure 10:
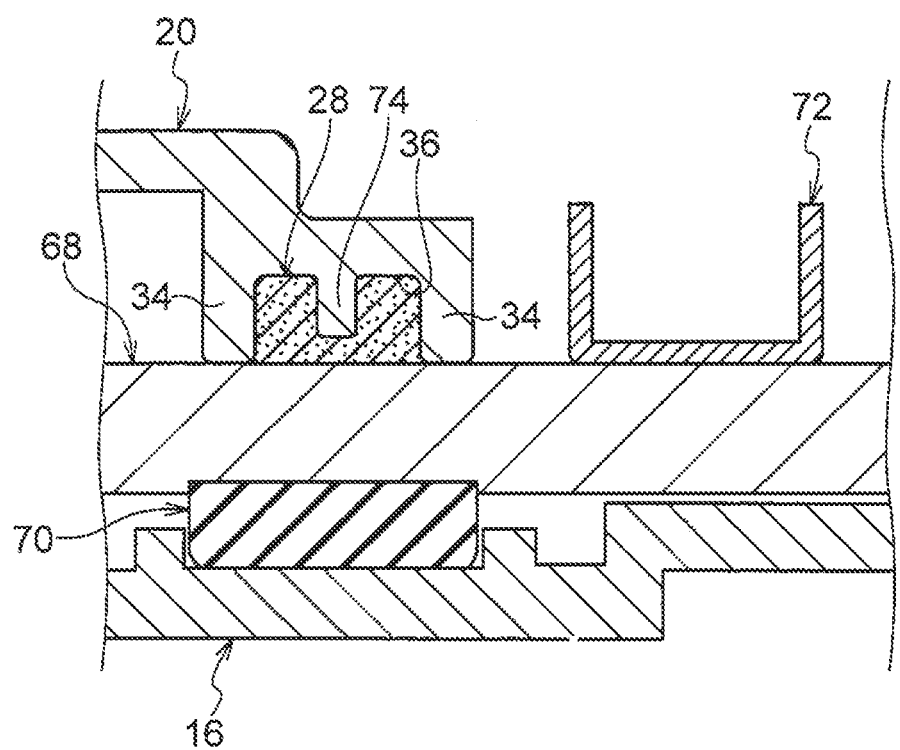
FIG. 10 is a cross-section, taken on line 10-10 in FIG. 9 and partially illustrating an electronic device of the first exemplary embodiment.

Note that the dividing plate 20 is formed with a pair of housing walls 34 that house the sealing member 28, as illustrated in FIG. 8, and FIG. 10, thereby housing the sealing member 28 in a housing groove 36 between the housing walls 34 and suppressing positional misalignment or detachment thereof.

As illustrated in FIG. 3, a single sheet, or plural sheets, of a substrate 38 are disposed in the liquid-stopper region 30 (only one sheet is illustrated in FIG. 3). Various heat emitting sections 40 are also disposed in the liquid-stopper region 30. Examples of the heat emitting sections 40 include an integrated circuit 40A such as a processor, a battery 40B that handles power supply to the electronic device 12, and a communications device 40C for external communication of the electronic device 12. The heat emitting sections 40 may be integrally mounted to the substrate 38, or may be a separate body from the substrate 38, electrically connected to the substrate 38 by a cable.

An opening 42 is formed in the dividing plate 20. The opening 42 is covered by a metal plate 44. The metal plate 44 may be irremovably fixed to the dividing plate 20, but making the metal plate 44 removable facilitates replacing and servicing of the heat emitting sections 40. For example, the metal plates 44 corresponding to the communications device 40C and the battery 40B are configured removable from the dividing plate 20 in the present exemplary embodiment. The metal plate 44 serves as an example of a dividing member.

Figure 2:
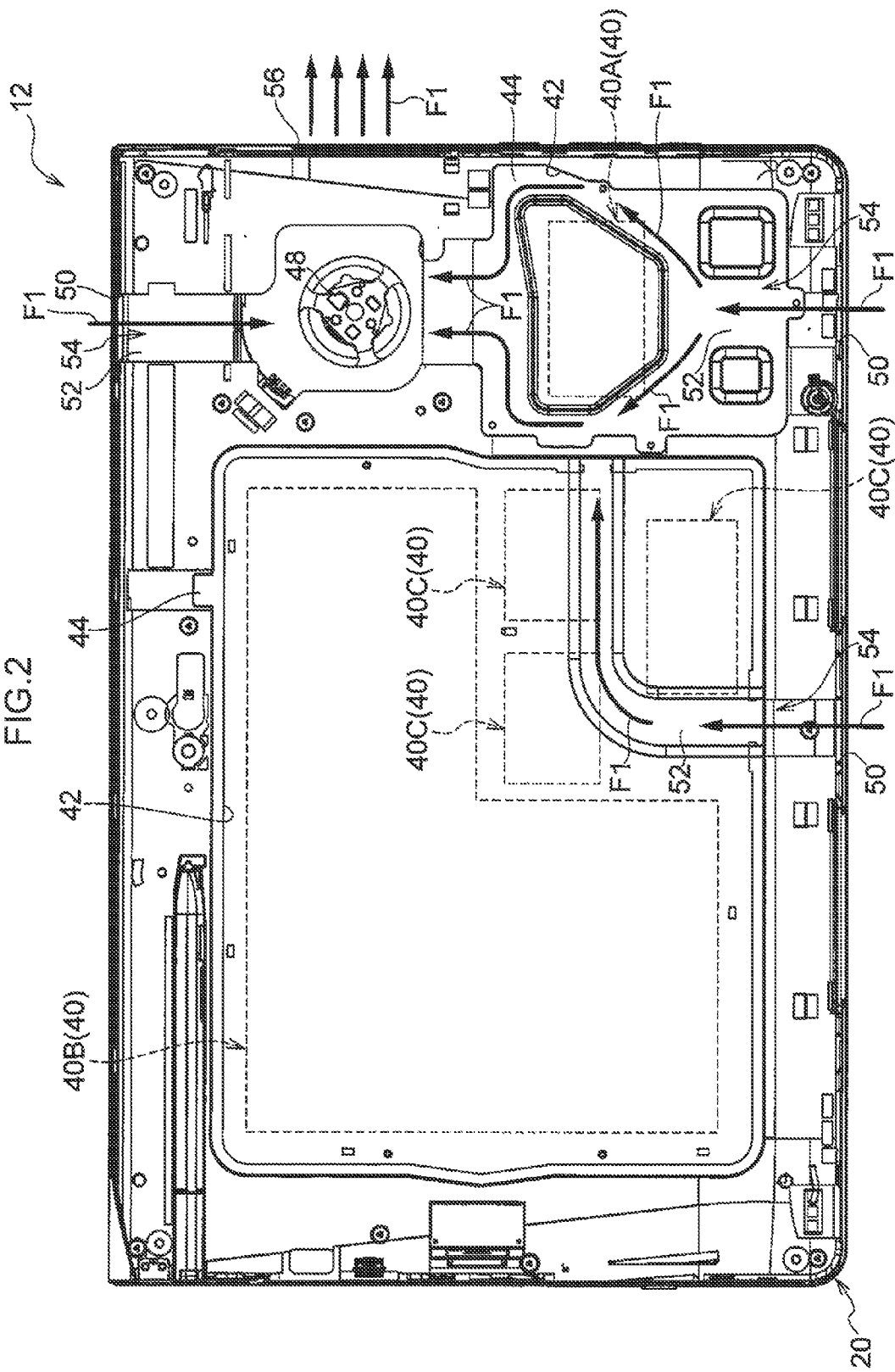
FIG. 2 is a plan view illustrating an interior of an electronic device of the first exemplary embodiment.

As illustrated in FIG. 3, a fan 46 is disposed in the exterior communication region 32. The fan 46 has a liquid-proof (water-proof) specification, and is liquid (water) resistant to the extent that liquid (water) adhering during ordinary usage does not affect its basic functionality. As illustrated in FIG. 2, ventilation holes 48 are formed in a portion of a dividing plate 20 section overlapping the fan 46 in plan view. The ventilation holes 48 enable the passage of air through the dividing plate 20, between the exterior communication region 32 and the second compartment 26. The ventilation holes 48 are examples of a ventilation pathway. When driven, the fan 46 blows air out from a blower 46A.

Figure 4:
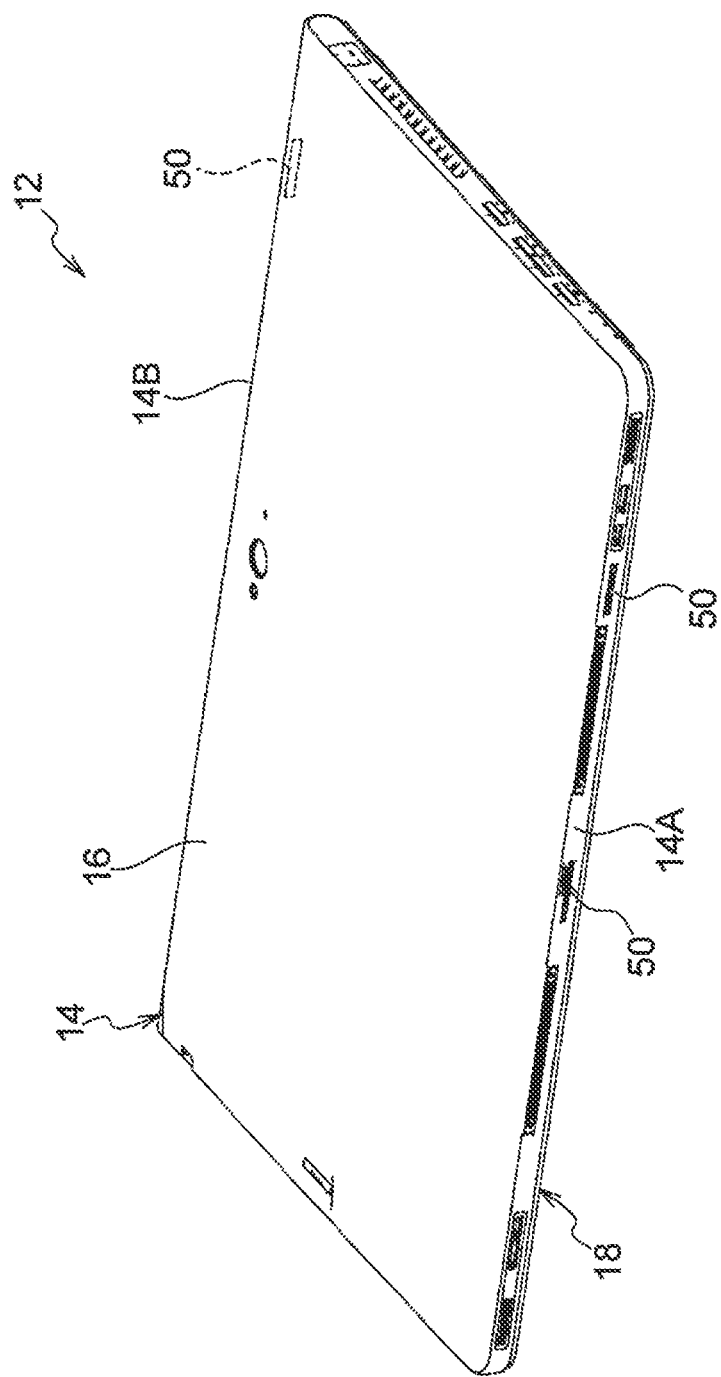
FIG. 4 is a perspective view illustrating an electronic device of the first exemplary embodiment.

As illustrated in FIG. 4, the housing body 14 is formed with a single, or plural, air intake holes 50 that enable the passage of air to and from the second compartment 26. In the particular example illustrated, two side faces of the housing body 14 (a nearside face 14A, and a back face 14B) are each formed with the air intake holes 50. When driven, the fan 46 draws in air external to the housing body 14 through the air intake holes 50.

The housing body 14 is formed with exhaust holes 56 that exhaust air from the blower 46A of the fan 46.

As illustrated in FIG. 2, the dividing plate 20 and the metal plate 44 are formed with indentation portions 52 that form airflow pathways 54 from the air intake holes 50 to the fan 46. The indentation portions 52 are provided at positions facing the heat emitting sections 40, or at positions from which heat is easily transmitted from the heat emitting sections 40. Driving the fan 46 enables air to be taken in through the air intake holes 50 of the housing body 14, and, as indicated by the arrows F1, to pass through the airflow pathways 54 and the ventilation holes 48 and be externally exhausted through the exhaust holes 56.

The airflow pathways 54 are formed at positions where heat is transmitted from the heat emitting sections 40, such as positions partially overlapping the heat emitting sections 40 in the plan view.

Figure 5:
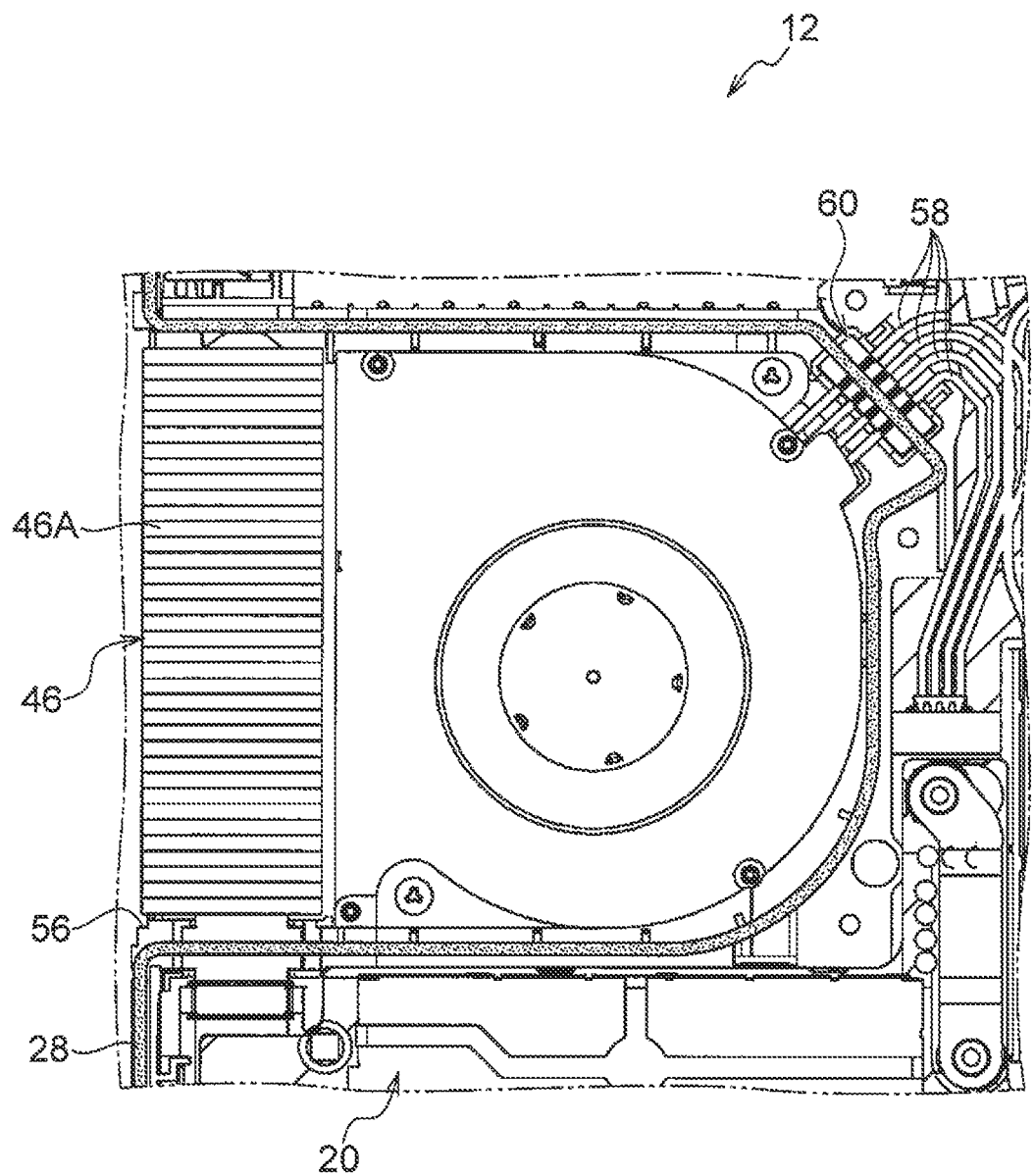
FIG. 5 is a plan view partially illustrating an electronic device of the first exemplary embodiment.
Figure 6:
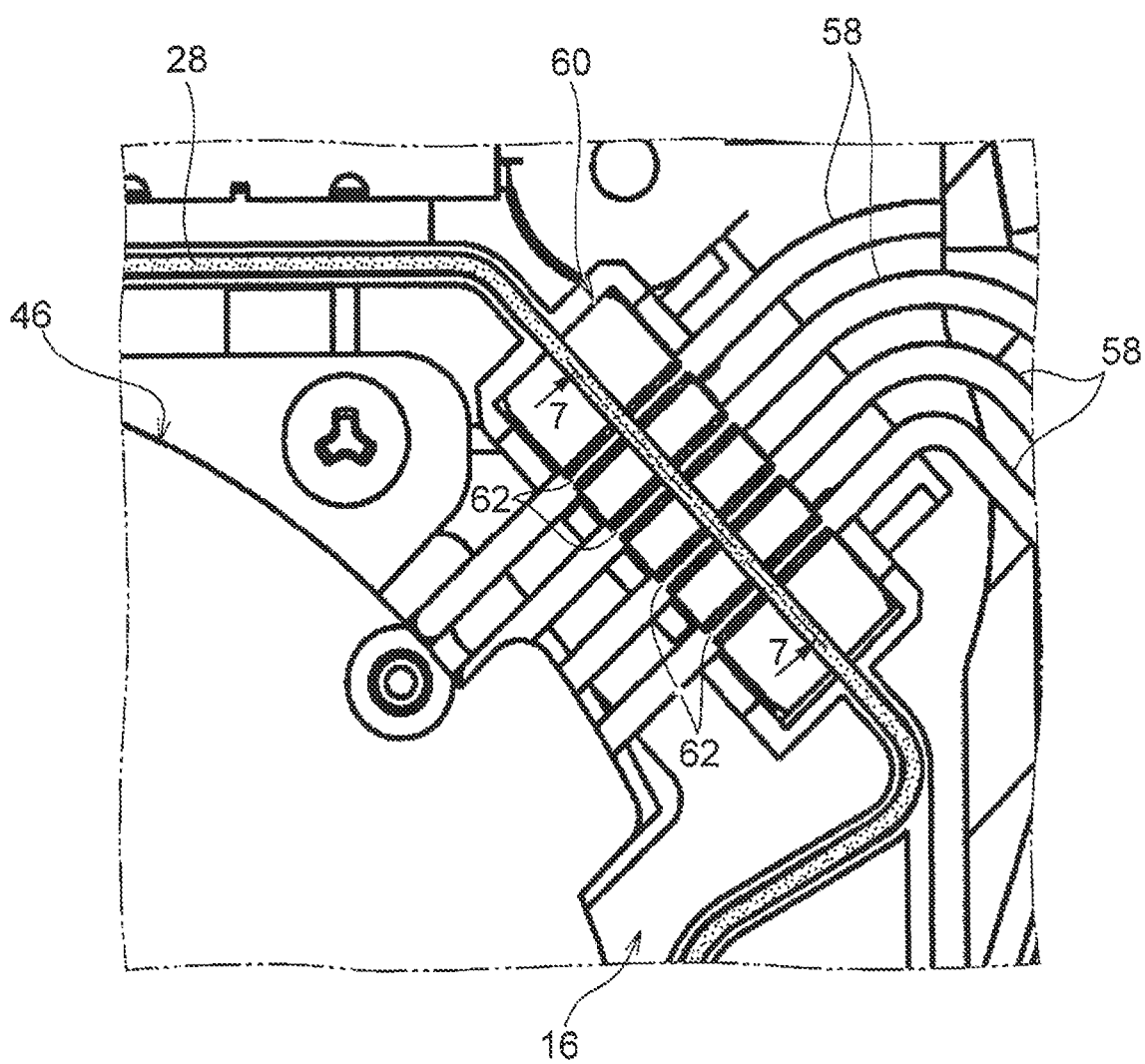
FIG. 6 is a plan view partially illustrating an electronic device of the first exemplary embodiment.

As illustrated in FIG. 3 and FIG. 5, the substrate 38 and the fan 46 are electrically connected by plural (four in the example illustrated) cables 58. Power supply, and drive control signal exchange, are performed from the substrate 38 to the fan 46 through the cables 58.

Packing 60 is disposed between the first plate member 16 and the sealing member 28, at a portion where the cables 58 overlap the sealing member 28 in the plan view. The packing 60 serves as an example of a first liquid-stopper member.

Figure 7:
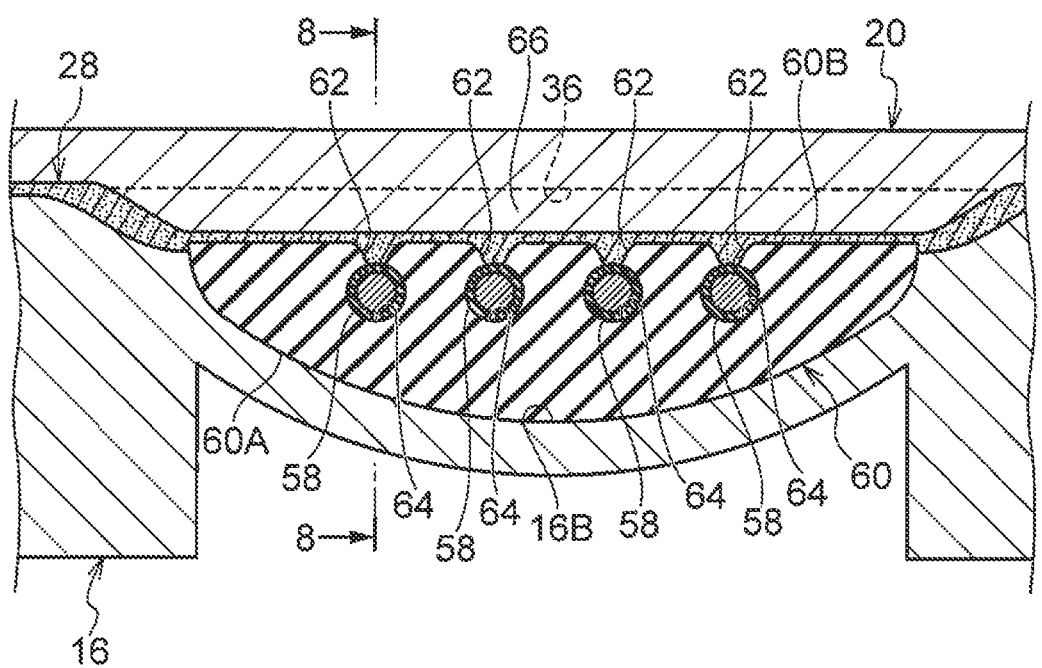
FIG. 7 is a cross-section, taken on line 7-7 in FIG. 6 and partially illustrating an electronic device of the first exemplary embodiment.

As illustrated in FIG. 7, in the packing 60, a portion facing the first plate member 16 is formed with a convex face 60A that curves with a protruding shape. In the first plate member 16, a portion in contact with the packing 60 is formed with a concave face 16B, in face-to-face contact with the convex face 60A. A liquid-tight (water-tight) seal is maintained between the first plate member 16 and the packing 60 by close contact between the convex face 60A and the concave face 16B. For example, even when there is variation in shape and position of the first plate member 16 and the packing 60, such variation is accommodated, and close contact still made between the first plate member 16 and the packing 60.

The opposite side of the packing 60 to the convex face 60A side is configured by a flat face 60B in close contact with the sealing member 28. The flat face 60B is formed with as many slits 62 as there are cables 58, and close-contact holes 64 are respectively formed at the far side of the slits 62. In a non-inserted state (a natural state) of the cables 58, the inner diameter of the close-contact holes 64 is smaller than the outer diameter of each of the cables 58. Each of the cables 58 is pressed onto the respective slit 62, and is press-fitted therein while pushing the slit 62 outwards. The cables 58 are thereby retained by the close-contact holes 64. The inner face of each of the close-contact holes 64 is in close contact with outer face of the cable 58 due to the close-contact holes 64 having an inner diameter smaller in the natural state than the outer diameter of the cables 58.

Each of the plural close-contact holes 64 are formed in the packing 60 so as to be separated from each other, and each of the plural cables 58 is retained in a close-contact state by one of the close-contact holes 64. Gaps do not arise between one of the cables 58 and another of the cables 58 in the close-contact holes 64, since plural cables 58 are not retained in a single close-contact hole 64.

The housing walls 34 of the dividing plate 20 push the packing 60 toward the first plate member 16, as illustrated in FIG. 8, increasing the degree of close contact between the packing 60 and the cables 58.

As illustrated in FIG. 7 and FIG. 8, at the location of the sealing member 28, a rib 66 is formed between the housing walls 34 so as to face the flat face 60B of the packing 60. The rib 66 locally crushes the sealing member 28, and a portion of the sealing member 28 is pushed into the slits 62 so as to reach as far as the cables 58, as illustrated in FIG. 7. The liquid-tightness (water-tightness) of the cables 58, the packing 60, and the sealing member 28 is thereby maintained.

As illustrated in FIG. 3, a heat pipe 68 is disposed between at least 1 of the heat emitting sections 40 that are mounted to the substrate 38 (the integrated circuit 40A in the example illustrated) and the blower 46A of the fan 46.

Figure 9:
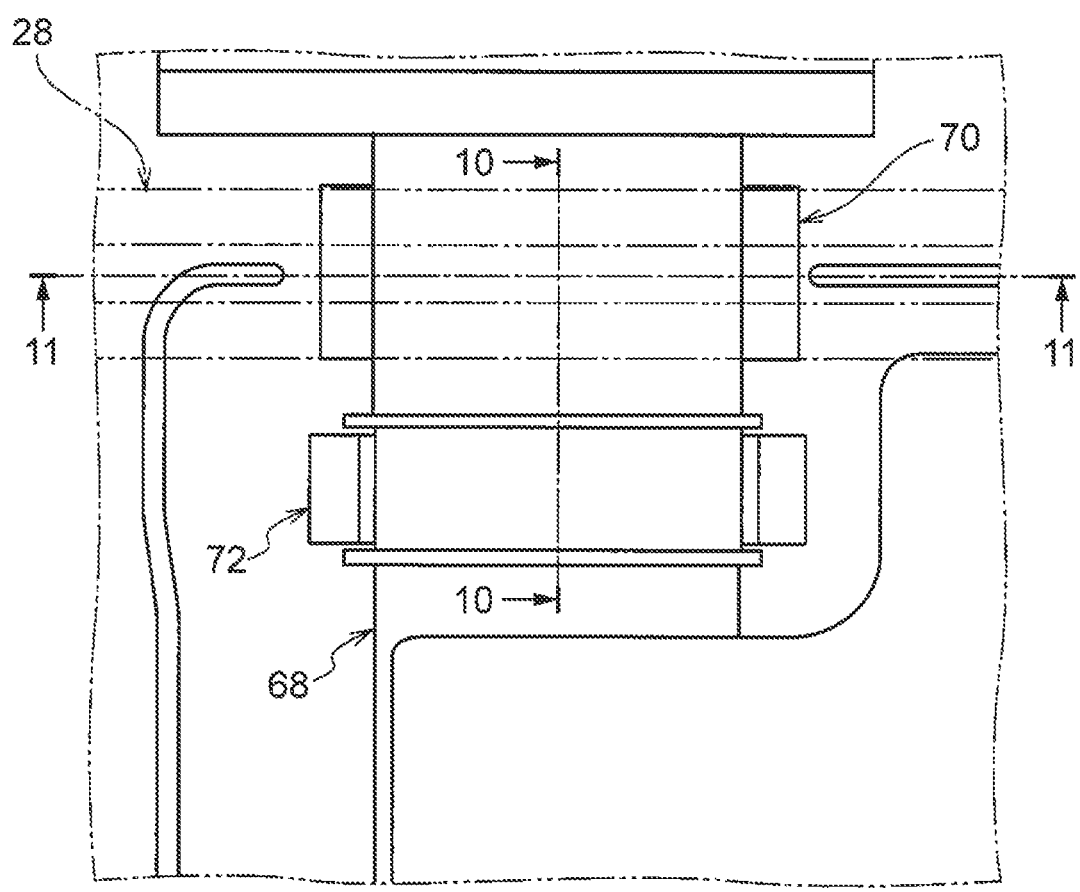
FIG. 9 is a plan view partially illustrating an electronic device of the first exemplary embodiment.
Figure 11:
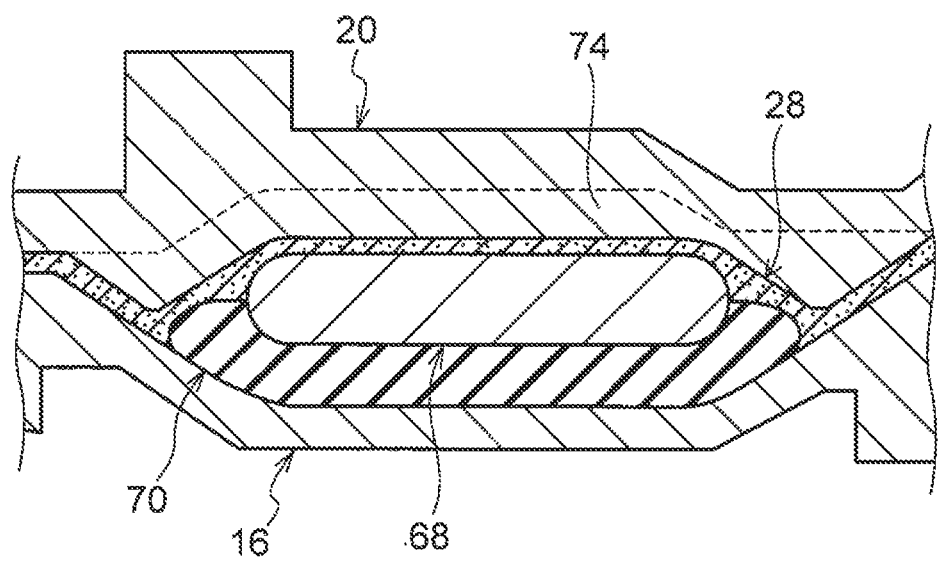
FIG. 11 is a cross-section, taken on line 11-11 in FIG. 9 and partially illustrating an electronic device of the first exemplary embodiment.

As illustrated in FIG. 9 to FIG. 11, packing 70 is disposed between the first plate member 16 (a portion of the housing body 14) and the heat pipe 68, at a portion where the heat pipe 68 overlaps the sealing member 28 in the plan view. The packing 70 serves as an example of a second liquid-stopper member.

A presser 72 is disposed with a gap to the dividing plate 20 at a position offset from the packing 70 in a longitudinal direction of the heat pipe 68.

As illustrated in FIG. 11, the sealing member 28 is positioned between the dividing plate 20, and the heat pipe 68, the packing 70, and the first plate member 16, so as to fill a gap therebetween.

At the dividing plate 20, a rib 74 is formed that pushes the sealing member 28 in toward the heat pipe 68 and the packing 70. The liquid-tightness between the sealing member 28 with the heat pipe 68 and the packing 70 is maintained by the rib 74 pushing the sealing member 28 toward the heat pipe 68 and the packing 70.

Note that a material having resilience and shape stability is applicable for the packing 60 and the packing 70. In the present exemplary embodiment, examples of materials that may be employed for the packing 60 and the packing 70 include rubbers and elastomers, in either their solid, or gel forms.

As illustrated in FIG. 10, the heat pipe 68 is pushed toward the packing 70 side by the presser 72. Positional misalignment of the heat pipe 68 with respect to the first plate member 16 is thereby suppressed, and the heat pipe 68 is fixed to the first plate member 16. Moreover, the liquid-tightness between the packing 60 and the heat pipe 68 is maintained due to the packing 60 being pushed by the heat pipe 68 and bowed by a specific amount.

Moreover, the heat pipe 68 pushes the packing 70 in toward the first plate member 16, such that even when there is variation in shape and position between the heat pipe 68 and the packing 70, and between the packing 70 and the first plate member 16, this variation is accommodated and close contact is made.

Explanation next follows regarding the operation of the present exemplary embodiment In the electronic device 12 of the present exemplary embodiment, the liquid-stopper region 30 is formed in the first compartment 24 of the housing body 14. External liquid does not penetrate into the liquid-stopper region 30, enabling liquid-proofing (water-proofing) of the heat emitting sections 40 and the substrate 38 (including for example elements mounted to the substrate 38) within the liquid-stopper region 30.

The fan 46 is disposed at the exterior communication region 32 of the first compartment 24. Driving the fan 46 enables air to be taken in through the air intake holes 50 of the housing body 14, as indicated by the arrows F1 in FIG. 2, to pass through the airflow pathways 54 and the ventilation holes 48, and be externally vented from the exhaust holes 56. This thereby enables cooling of the heat emitting sections 40 in the first compartment 24 by the flow of air through the second compartment 26 (and particularly through the airflow pathways 54).

In the present exemplary embodiment in particular, the opening 42 is formed in a portion of the dividing plate 20, and the heat emitting sections 40 are disposed in contact with the metal plate 44 blocking the opening 42. Accordingly, compared to a structure in which the heat emitting sections 40 are disposed away from the metal plate 44 (the dividing member), cooling is highly effective since heat transmitted from the heat emitting sections 40 to the dividing member can be cooled by airflow in the second compartment 26.

In the present exemplary embodiment, the metal plate 44 is a portion of the dividing member, and the heat emitting sections 40 are in contact with the metal plate 44. Heat from the heat emitting sections 40 is therefore more easily transmitted to the metal plate 44, and the heat emitting sections 40 are cooled with higher efficiency, than in a structure in which the heat emitting sections 40 are in contact with a member made of a material other than metal (such as a resin member).

The air intake holes 50 are formed in the housing body 14, and there are plural of the air intake holes 50. Plural regions of fast airflow speed therefore arise in the second compartment 26 due to air flowing into the second compartment 26 through the plural air intake holes 50. Cooling of the heat emitting sections 40 is therefore enabled over a wider area compared to structures in which there is only a single air intake hole 50.

In particular, in a structure in which the plural air intake holes 50 are formed in each of the plural side faces in the housing body 14, as illustrated in FIG. 4, cooling of the heat emitting sections 40 is enabled over a wider area due to plural regions of fast airflow speed arising in the second compartment 26. The air intake holes 50 are not provided to the back face 14B of the housing body 14, enabling improved aesthetics of the electronic device 12.

The indentation portions 52, that form the airflow pathways 54 from the air intake holes 50 to the fan 46, are formed to the dividing plate 20 and the metal plate 44. Effective cooling of the heat emitting sections 40 is accordingly enabled by guiding air flowing in through the air intake holes 50 to positions facing the heat emitting sections 40, or to position to which heat from the heat emitting sections 40 is easily transmitted.

In the present exemplary embodiment, the substrate 38 and the fan 46 are electrically connected together by the cables 58. The cables 58 enable supply of power to the fan 46, and the exchange of drive control signals to be performed. Namely, electrical connection is enabled between the substrate 38 that is disposed in the liquid-stopper region 30, and the fan 46 that is disposed in the exterior communication region 32.

Liquid flow is stopped by the packing 60 (an example of the first liquid-stopper member) between the sealing member 28 and the cables 58. Liquid is accordingly suppressed from flowing between the sealing member 28 and the cables 58, enabling a high liquid-stopping (water-stopping) performance in the liquid-stopper region 30 to be maintained.

The plural cables 58 are retained in a separated state from each other (as individual cables 58) in close contact with the respective close-contact holes 64 of the packing 60. Since the plural cables 58 are not retained grouped together, gaps do not arise between the cables 58, enabling liquid to be suppressed from permeating into the liquid-stopper region 30 through such gaps.

Each of the slits 62 of the packing 60 is pushed in by a portion of the sealing member 28. The slits 62 are closed off by the sealing member 28, enabling liquid to be prevented from permeating into the liquid-stopper region 30 through the slits 62.

In the present exemplary embodiment, the heat pipe 68 is disposed between at least one of the heat emitting sections 40 and the blower 46A. The heat from the heat emitting sections 40 is transmitted to the heat pipe 68. The heat pipe 68 is then cooled by an airstream blown out from the fan 46 at the blower 46A. Namely, since the heat emitting sections 40 are cooled by the airstream from the fan 46 via the heat pipe 68, effective cooling of the heat emitting sections 40 is enabled in comparison to structures not including the heat pipe 68.

Liquid (water) is stopped by the packing 70 (an example of the second liquid-stopper member) between the first plate member 16 (a portion of the housing body 14) and the heat pipe 68. This thereby suppresses liquid from flowing between the first plate member 16 and the heat pipe 68, enabling a high liquid-stopping performance of the liquid-stopper region 30 to be maintained.

The sealing member 28 is in close contact with the heat pipe 68 from the side opposite to the packing 70 side. This thereby suppresses liquid from flowing between the heat pipe 68 and the sealing member 28, enabling a high liquid-stopping performance of the liquid-stopper region 30 to be maintained.

In the description above, the housing body 14 includes the first plate member 16 and the second plate member 18, and an example has been given of a structure in which the dividing member is the dividing plate 20 and the metal plate 44 disposed facing the first plate member 16 and the second plate member 18. However, the structure of the housing body 14 is not limited thereto. The housing body 14 may, for example, be a member with a simple box shape. The dividing member does not need to be formed with a plate shape; in essence, any member, such as, for example, a curved member may be employed as long as the first compartment and the second compartment are divided in the housing body 14. As described above, disposing the first plate member 16 facing the second plate member enables the housing body 14 to be made thin overall.

Moreover, disposing the dividing plate 20 and the metal plate 44 facing the first plate member 16 and the second plate member 18 enables division of the inside of the thinned housing body 14 in the thickness direction, into the first compartment 24 and the second compartment 26.

A structure can thereby be achieved having a thinned housing body 14, and giving enhanced cooling performance for the heat emitting sections 40 in a liquid-resistant model of the electronic device 12 that maintains liquid-stopping performance (liquid resistance) in the liquid-stopper region 30.

Explanation has been given above regarding an exemplary embodiment of technology disclosed in the present specification. However, technology disclosed in the present specification is not limited by the descriptions above. Obviously, in addition to the above, various modifications are possible within a range that does not deviate from the spirit of the invention.

According to technology disclosed in the present specification, enhanced cooling performance can be achieved for a liquid-resistant model of an electronic device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

All cited documents, patent applications and technical standards mentioned in the present specification are incorporated by reference in the present specification to the same extent as if the individual cited documents, patent applications and technical standards were specifically and individually incorporated by reference in the present specification.

What is claimed is:

1. An electronic device comprising:
a housing body that includes a first plate member, and a second plate member disposed facing the first plate member;
a dividing member that is disposed between the first plate member and the second plate member and that is parallel to the first plate member, a surrounding of the dividing member touching the housing body and dividing a space between the first plate member and the second plate member into a first compartment and a second compartment;
a sealing member that forms a closed curve, that is disposed in the first compartment, that makes close contact with the first plate member and the dividing member, and that divides the first compartment into a liquid-stopper region and an exterior communication region;
a substrate that is a separate body from the dividing member, wherein in plan view, the substrate is located inside of the outline of the dividing member and is disposed in the liquid-stopper region, and one or more heat emitting components are mounted on the substrate;
a fan disposed in the exterior communication region; and
ventilation holes formed in a portion of the dividing member, through which an airflow passes to the second compartment due to driving the fan.

2. The electronic device of claim 1, wherein at least one of the heat emitting components is disposed in contact with the dividing member.

3. The electronic device of claim 1, wherein a contact portion of the dividing member, which is in contact with the heat emitting component, is made of metal.

4. The electronic device of claim 3, wherein the contact portion is a metal plate that is removable from the dividing member.

5. The electronic device of claim 4, wherein, when the metal plate is in a state of being attached to the dividing member, the metal plate covers an opening in the dividing member.

6. The electronic device of claim 1, wherein a plurality of air intake holes are provided for air to flow to the second compartment.

7. The electronic device of claim 6, wherein the air intake holes are provided at a plurality of side faces of the housing body.

8. The electronic device of claim 1, further comprising:
a cable that electrically connects the substrate to the fan.

9. The electronic device of claim 8, further comprising a first liquid-stopper member that acts as a liquid-stopper between the sealing member and the cable.

10. The electronic device of claim 9, wherein:
a plurality of the cables are provided; and
the first liquid-stopper member includes close-contact holes that make close contact with, and retain; each of the cables with the plurality of cables in a separated state.

11. The electronic device of claim 10, wherein the close contact holes each retain one out of the plurality of cables.

12. The electronic device of claim 10, wherein:
the first liquid-stopper member is formed with slits in the close contact holes to house the cables; and
the sealing member partially enters the slits.

13. The electronic device of claim 9, wherein:
the first liquid-stopper member includes slits through which each of the plurality of the cables is passed, and an inner diameter of each of the close-contact holes is smaller than an outer diameter of each of the cables.

14. The electronic device of claim 1, further comprising a heat pipe that places at least one of the heat emitting components in communication with a blower of the fan airstream in the exterior communication region.

15. The electronic device of claim 14, further comprising a second liquid-stopper member that acts as a liquid-stopper between the housing body and the heat pipe.

16. The electronic device of claim 15, wherein the sealing member is in close contact with the heat pipe at an opposite side from a second liquid-stopper member side.

* * * * *